US007626833B1

(12) United States Patent
Yu

(10) Patent No.: US 7,626,833 B1
(45) Date of Patent: Dec. 1, 2009

(54) SWITCH ASSEMBLING STRUCTURE

(76) Inventor: Tsung Mou Yu, No. 4, Alley 2, Lane 23, Sec. 3, Pa Te Road, Panchiao, Taipei (TW)

( * ) Notice: Subject to any disclaimer, the term of this patent is extended or adjusted under 35 U.S.C. 154(b) by 0 days.

(21) Appl. No.: 12/476,151

(22) Filed: Jun. 1, 2009

(51) Int. Cl.
*H05K 7/10* (2006.01)

(52) U.S. Cl. ........................ 361/837; 361/832; 200/293

(58) Field of Classification Search ................. 361/643, 361/828, 837, 832; 200/237, 293, 303; 337/34, 337/20, 112, 186; 335/202; 439/620.26
See application file for complete search history.

(56) References Cited

U.S. PATENT DOCUMENTS 3,242,273 A * 3/1966 van der Put ............... 200/16 B
3,993,971 A * 11/1976 Ono et al. ................... 335/202
5,153,401 A * 10/1992 Tseng ........................ 200/550
6,224,401 B1 * 5/2001 Yu ............................. 439/139
6,563,414 B2 * 5/2003 Yu ............................. 337/66

* cited by examiner

*Primary Examiner*—Dameon E Levi

(57) ABSTRACT

A switch assembling structure is provided. The switch assembling structure includes a body and a side plate. The assembling structure can be conveniently and fast assembled by buckling and plugging operations. The assembling structure is adapted for substituting the conventional assembling methods such as riveting and screwing, so as to save the production cost and improve the overall yield.

2 Claims, 4 Drawing Sheets

SWITCH ASSEMBLING STRUCTURE

BACKGROUND OF THE INVENTION

1. Field of the Invention

The present invention relates generally to a switch structure, and more particularly, to a switch assembling structure.

2. The Prior Arts

Power switches are widely applied in many fields. Power switches are necessary components for controlling powers of home electrical appliances, instruments and equipments, as well as electrical systems of buildings, and thus are highly demanded in the market.

When assembling a conventional power switch, necessary components are firstly disposed in a body as designed, and then a side cover is provided at one lateral side of the body and fixed thereto. Typically, the side cover is usually fixed to the body by riveting with a rivet or screwing with a screw nut. However, riveting and screwing involve relatively complicated processing procedures, and the materials (e.g., the rivet, or the screw nut), the manpower used for processing, and the automotive tools required for the processing introduce additional burden of production cost. The complicated procedure also disadvantageously prolongs the processing and assembling time, thus affecting the overall yield of the products.

SUMMARY OF THE INVENTION

A primary objective of the present invention is to provide an assembling structure which can be conveniently and fast assembled. The assembling structure is adapted for substituting the conventional assembling methods such as riveting and screwing, so as to save the production cost and improve the overall yield.

For achieving the foregoing objective, the present invention provides an assembling structure. The assembling structure includes a body configured as a module, and a side plate. The body includes an opening, a switch base, a plurality of conductive plate bases, and a first assembling unit. The opening is configured at a lateral side of the body. The switch base is provided at an end of the body. The plurality of conductive plate bases are provided at another end of the body. The first assembling unit includes a first resisting plane, a plurality of plugging holes, a plurality of hooks, and a plurality of positioning poles. The first resisting plane is provided at a lateral edge of the opening. The plugging holes are configured at an opposite side of the first resisting plane of the body. The hooks are provided at an opposite side of the switch base of the body. The positioning poles are disposed at two sides of the opening, respectively.

The side plate is a plate shaped module including a second assembling unit. The second assembling unit includes a second resisting plane, a plurality of plugging poles, a plurality of buckles, and a plurality of positioning holes. The second assembling unit is provided at a lateral edge of the side plate. The plugging poles are configured at a side of the side plate. The buckles are configured at the opposite side of the second resisting plane of the side plate. Each of the buckles is configured with a buckle slot corresponding to a hook of the body. The positioning holes are configured through the side plate. The first resisting plane, the plugging holes, the hooks, and the positioning poles of the first assembling unit are provided for correspondingly matching with the second resisting plane, the plugging poles, the buckles, and the positioning holes of the second assembling unit, respectively.

According to the present invention as aforementioned, in assembling the power switch, the related components are arranged inside the body as designed and are ready for final assembling. Then, the plugging poles of the side plate are aligned toward the plugging holes of the body, and plug in along the direction of the plugging holes. Meanwhile, the buckle slots of the buckles of the side plate are buckled with the corresponding hooks, and the positioning holes of the side plate are also plugged with the corresponding positioning poles. When the second resisting plane reaches to check with the first resisting plane, the assembly of the body and the side plate is completed.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
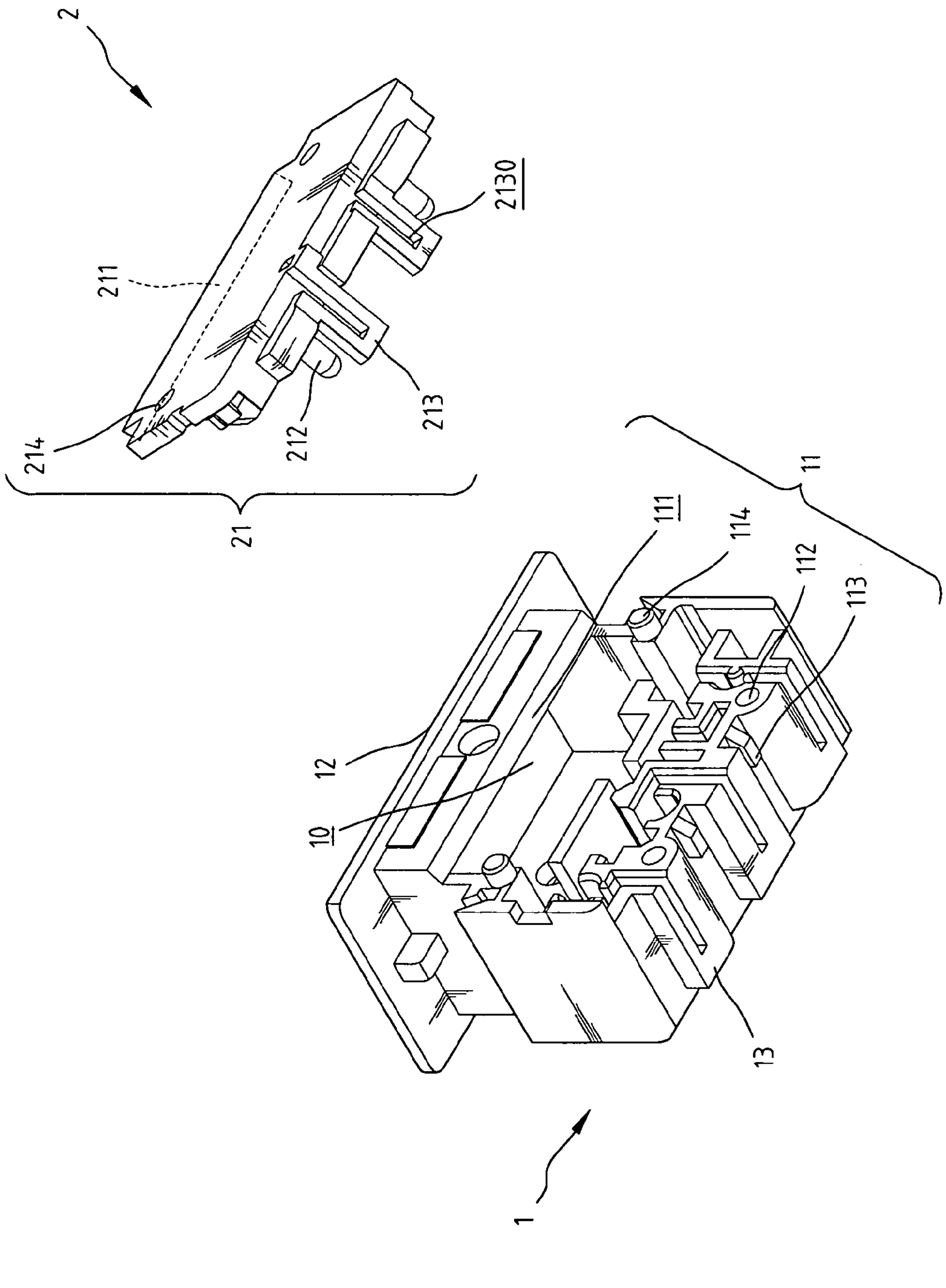
FIG. 1 is an exploded perspective view of a switch assembling structure according to the present invention.
Figure 3:
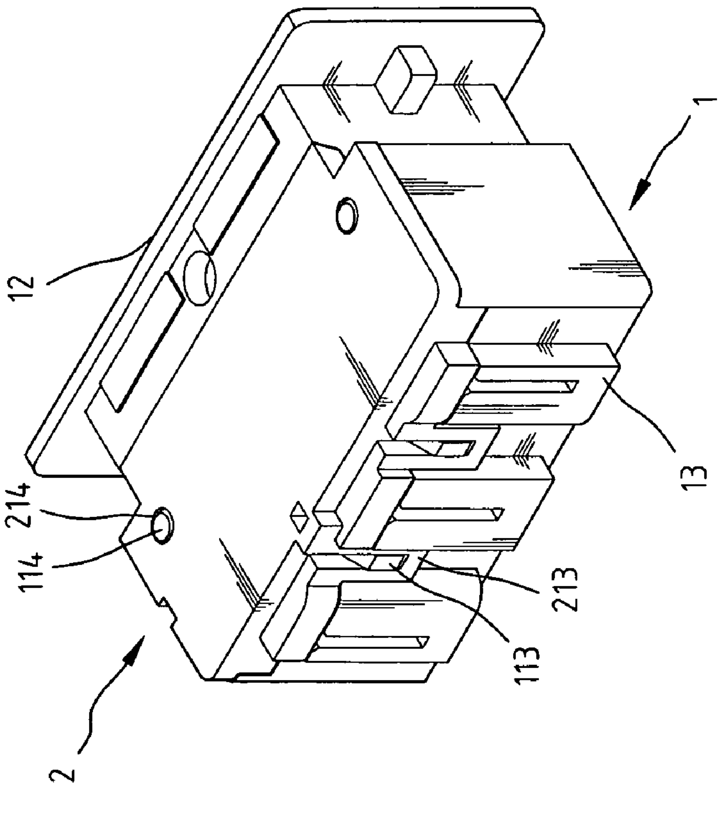
FIG. 3 is a perspective view of an assembled switch assembling structure according to the present invention.
Figure 4:
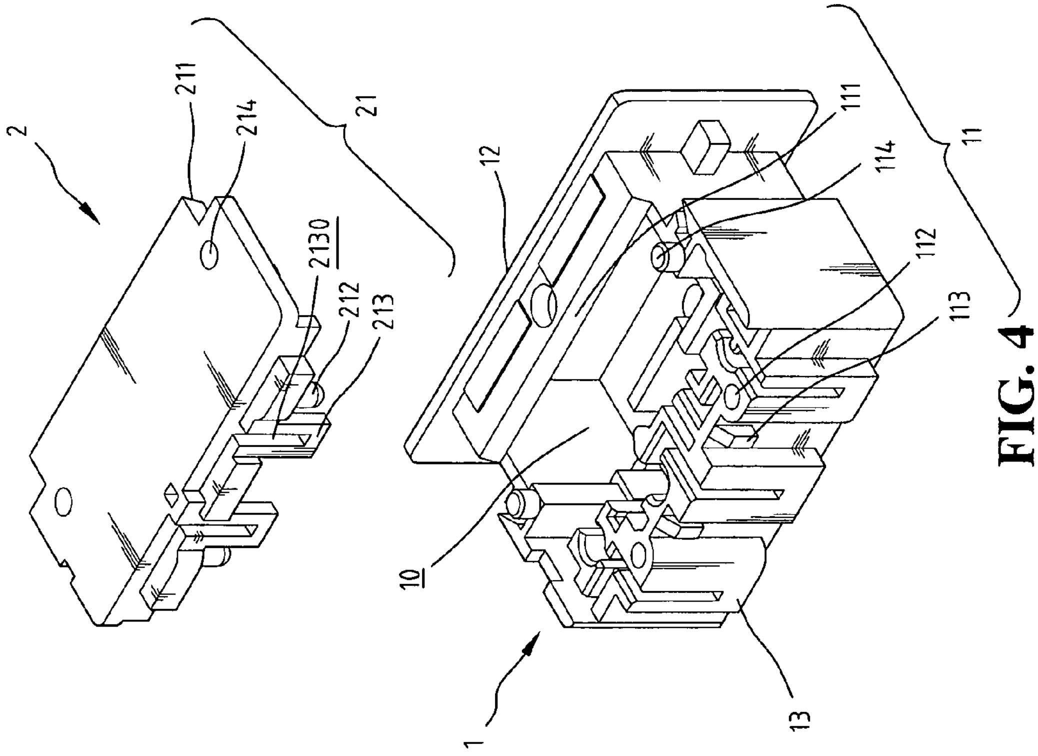
FIG. 4 is another perspective view of the switch assembling structure according to the present invention.

FIG. 1 is an exploded perspective view of a switch assembling structure according to the present invention. FIG. 3 is a perspective view of an assembled switch assembling structure according to an embodiment of the present invention. FIG. 4 is another perspective view of the switch assembling structure according to the present invention. Referring to FIGS. 1, 3, and 4, the present invention provides a switch assembling structure. The assembling structure includes a body 1 configured as a module, and a side plate 2. The body 1 includes an opening 10, a switch base 12, a plurality of conductive plate bases 13, and a first assembling unit 11. The opening 10 is configured at a lateral side of the body 1. The switch base 12 is provided at an end of the body 1. The conductive plate bases 13 are provided at another end of the body 1. The first assembling unit 11 includes a first resisting plane 111, a plurality of plugging holes 112, a plurality of hooks 113, and a plurality of positioning poles 114. The first resisting plane 111 is provided at a lateral edge of the opening 10. The plugging holes 112 are configured at the opposite side of the first resisting plane 111 of the body 1. The hooks 113 are provided at the opposite side of the switch base 12 of the body 1. The positioning poles 114 are disposed at two sides of the opening 10, respectively.

The side plate 2 is substantially a plate shaped module including a second assembling unit 21. The second assembling unit 21 includes a second resisting plane 211, a plurality of plugging poles 212, a plurality of buckles 213, and a plurality of positioning holes 214. The second assembling unit 21 is provided at a lateral edge of the side plate 2. The plugging poles 212 are configured at a side of the side plate 2. The buckles 213 are configured at the opposite side of the second resisting plane 211 of the side plate 2. Each of the buckles 213 is configured with a buckle slot 2130 which is corresponding to a hook 113 of the body 1. The positioning holes 214 are disposed at the side plate 2. The first resisting plane 111, the plugging holes 112, the hooks 113, and the positioning poles 114 of the first assembling unit 11 are provided for correspondingly combining with the second resisting plane 211, the plugging poles 212, the buckles 213, and the positioning holes 214 of the second assembling unit 21, respectively.

Figure 2:
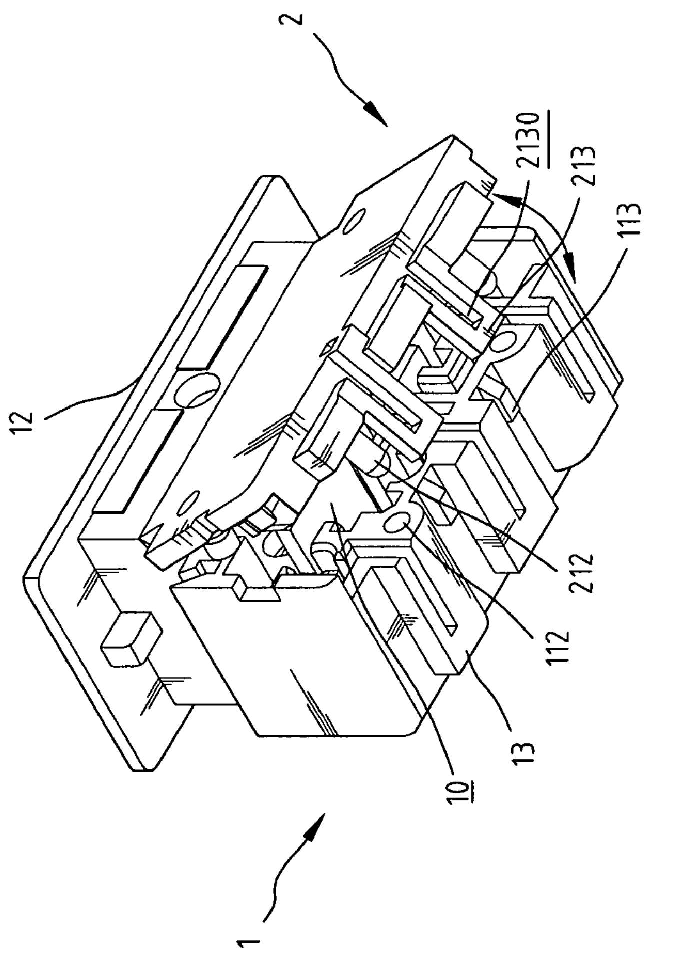
FIG. 2 is an assembled schematic view of a switch assembling structure according to an embodiment of the present invention.

FIG. 2 is an assembled schematic view of a switch assembling structure according to the present invention. Referring to FIG. 2, in assembling the power switch, the related components are arranged inside the body 1 and are ready for final assembling. Then, the plugging poles 212 of the side plate 2 are aligned toward the plugging holes 112 of the body 1, and plug in along the direction of the plugging holes 112. Meanwhile, the buckle slots 2130 of the buckles 213 of the side plate 2 are buckled with the corresponding hooks 113, and the positioning holes 214 of the side plate 2 are also plugged with the corresponding positioning poles 114. When the second resisting plane 211 of the side plate 2 and the first resisting plane 111 of the body 1 are combined together, and then the assembling of the body 1 and the side plate 2 is completed as shown in FIG. 3.

The present invention provides an assembling structure which can be conveniently and fast assembled by buckling and plugging operations. The assembling structure is adapted for substituting the conventional assembling methods such as riveting and screwing, so as to save the production cost and improve the overall yield.

In addition to the foregoing advantages, in case a failure of the switch occurs, the side plate 2 can be conveniently removed from the body 1 without facilitation of tools. The condition inside the body 1 can also be conveniently inspected without destroying the module of the body 1, so that the maintenance or parts replacement can be conveniently executed.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A switch assembling structure, comprising:

a body, having an opening configured at a lateral side of the body, the body including a first assembling unit, the first assembling unit including:

a first resisting plane, provided at a lateral edge of the opening;

a plurality of plugging holes, configured at a side of the body opposite to the first resisting plane;

a plurality of hooks; and a plurality of positioning poles; and a side plate, including a second assembling unit adapted for assembling with the first assembling unit, the second assembling unit including:

a second resisting plane, provided at a lateral edge of the side plate;

a plurality of plugging poles;

a plurality of positioning holes; and a plurality of buckles, wherein each of the buckles is configured with a buckle slot, the buckle slots corresponding to the hooks of the body, wherein the plugging holes, the hooks, and the positioning poles of the first assembling unit are correspondingly assembled with the plugging poles, the buckles, and the positioning holes of the second assembling unit, respectively.

2. The switch assembling structure as claimed in claim 1, wherein the first resisting plane of the first assembling unit is matching with the second resisting plane of the second assembling unit.

* * * * *